United States Patent [19]

Rosenmayer et al.

[11] Patent Number: 5,473,119
[45] Date of Patent: Dec. 5, 1995

[54] STRESS-RESISTANT CIRCUIT BOARD

[75] Inventors: C. Thomas Rosenmayer, Pflugerville, Tex.; Paul Fischer, Eau Claire, Wis.

[73] Assignee: W. L. Gore Associates, Inc., Newark, Del.

[21] Appl. No.: 368,315

[22] Filed: Dec. 30, 1994

Related U.S. Application Data

[63] Continuation-in-part of Ser. No. 15,202, Feb. 5, 1993, abandoned.

[51] Int. Cl.$^6$ ..................................... H05K 1/03
[52] U.S. Cl. .................. 174/255; 174/250; 174/258; 174/260; 174/266; 361/750
[58] Field of Search ................... 174/250, 255, 174/258, 260, 262, 266; 361/748, 750, 760

[56] References Cited

U.S. PATENT DOCUMENTS

| | | | |
|---|---|---|---|
| 3,541,222 | 11/1970 | Parks et al. | 174/68.5 |
| 3,934,959 | 1/1976 | Gilissen | 339/17 M |
| 4,194,209 | 3/1980 | Coulbourn, Jr. | 343/753 |
| 4,547,146 | 10/1985 | Yeh et al. | 428/332 |
| 4,755,911 | 7/1988 | Suzuki | 361/414 |
| 4,991,290 | 2/1991 | MacKay | 29/884 |
| 5,046,953 | 9/1991 | Shreeve et al. | 439/66 |
| 5,049,084 | 9/1991 | Bakke | 439/66 |
| 5,103,293 | 4/1992 | Bonafino et al. | 357/80 |

FOREIGN PATENT DOCUMENTS

| | | |
|---|---|---|
| 0064854 | 5/1982 | European Pat. Off. . |
| 0299894 | 7/1988 | European Pat. Off. . |
| 0361461 | 9/1989 | European Pat. Off. . |
| 0412323 | 7/1990 | European Pat. Off. . |
| 0521483 | 7/1992 | European Pat. Off. . |

*Primary Examiner*—Laura Thomas
*Attorney, Agent, or Firm*—Victor M. Genco, Jr.

[57] ABSTRACT

A circuit board resists shear stress caused by the unequal thermal coefficients of expansion of a mounted electronic component and a circuit board upon which it is mounted. The circuit board is defined by a support layer, a shear stress-relieving layer and a conductive layer. The shear stress-relieving layer comprises a layer of expanded polytetrafluoroethylene having a compressive modulus of less than 50,000 pounds per square inch.

8 Claims, 2 Drawing Sheets

STRESS-RESISTANT CIRCUIT BOARD

RELATED APPLICATIONS

This is a continuation-in-part of application Ser. No. 08/015,202 filed Feb. 5, 1993, now abandoned.

FIELD OF THE INVENTION

The present invention relates generally to circuit boards or printed wiring boards. More particularly, the present invention is directed to a method and apparatus for providing a stress-resistant circuit board which mitigates structural degradation of the circuit board to component interconnection caused by uneven thermal expansion between a circuit board and an electrical component mounted thereupon.

BACKGROUND OF THE INVENTION

Surface mounting electronic components, such as semiconductor chips, upon circuit boards or printed wiring boards has become popular. Typically, electronic component surface mounting is achieved through the controlled collapse of predetermined solder bumps or droplets. More particularly, predetermined arrays of solder bumps are arranged on conductive metal terminals of a semiconductor chip, or other electronic component to be surface mounted. Additionally, predetermined arrays of solder bumps are positioned on matching footprints of conductive terminals which are located on the surface of a predetermined circuit board. Thereafter, the electronic components are aligned upside down, i.e. face down on a circuit board. Heat is then applied to reflow the solder bumps into firm solid connections between such electronic components and the mating circuit board. Conductive adhesives may also be substituted for solder in a typical surface mounting process.

Widespread use of such surface mounting techniques has brought with it concerns over the reliability and integrity of the resulting adhesive and/or roller joints. In the past, joint cracking and other circuit board structural disturbances have been experienced, such as but not limited to, circuit board warping and structural failure of the electronic component itself. These structural disturbances are believed to be caused by the existence of unequal thermal coefficients of expansion vis-a-vis the electronic components to be mounted and the printed circuit boards. For example, when heat cycling is applied to reflow the solder, the electronic components and the circuit boards do not expand evenly across their own surfaces. This is true even if electronic components and circuit boards of equal thermal coefficients of expansion are utilized.

Various efforts have been employed to reduce the detrimental effects of such unequal thermal coefficients of expansion. Such efforts have included the following: modifying the solder array geometry by deleting corner solder bumps; using circular or other symmetrical arrays of solder bumps and contact pads; and physically supporting the electronic component by injecting an elastomeric support resin between the component and the circuit board. Other methods are described in U.S. Pat. Nos. 3,541,222; 3,934,959; 4,194,209; 4,847,146; 4,991,290; 5,046,953, and 5,049,084.

In U.S. Pat. No. 4,847,146, a process is disclosed for fabricating a compliant layer board with selectively isolated solder pads. In accordance with this process, an expansion layer is provided which includes a top surface and a bottom surface. The bottom surface of the expansion layer is bonded to a top surface of a support layer by way of an adhesive layer, except that the bottom surface of the expansion layer is not bonded to the support layer underneath an electronic component to be mounted. In theory, it is asserted that such a construction provides an expansion area wherein the expansion layer is free to expand and contract with an electronic component irrespective of the remainder of the printed circuit board.

Although the foregoing attempts to solve the problems in this area may have been met with varying degrees of success, they continue to suffer from a multiplicity of shortcomings which detract from their usefulness. For example, the process of U.S. Pat. No. 4,847,146 may require a manufacturer of printed circuit boards to customize the expansion layer of each board, which may be extremely costly and time consuming. Also, the expansion area discussed in U.S. Pat. No. 4,847,146 may attract process chemicals, debris and/or moisture which may eventually lead to premature structural failure of the circuit board or the electronic component.

Accordingly, there exists a continuing need to provide a stress-resistant circuit board which mitigates structural degradation of the circuit board caused by uneven thermal expansion between a circuit board and any electrical components mounted thereupon.

SUMMARY OF THE INVENTION

In one aspect of the present invention a circuit board is provided having first and second surfaces. The circuit board mounts at least one electronic component on a predetermined circuit board surface. The circuit board comprises a support layer, having a top and a bottom surface, and a means for absorbing shear stress caused by unequal thermal coefficients of expansion of the at least one electronic component and the circuit board. The shear stress absorbing means is defined by a layer of expanded polytetrafluroethylene having a compressive modulus of less than 50,000 PSI. The layer of expanded polytetrafluroethylene is completely bonded to the top surface of the support layer. A medium is provided for completely bonding the shear stress absorbing means to the support layer. A conductive layer is bonded to the shear stress absorbing means. At least one electronic component is electrically connected to the conductive layer.

It is a purpose of the present invention to reduce joint cracking between an electronic component and a circuit board.

It is another purpose of the present invention to provide a circuit board which resists shear stress caused by unequal thermal coefficients of expansion between the an electronic component and the circuit board.

The foregoing and other aspects will become apparent from the following detailed description of the invention when considered in conjunction with the accompanying drawing figures.

DETAILED DESCRIPTION OF THE INVENTION

With reference to the drawings, the invention is now described in detail.

Figure 2:
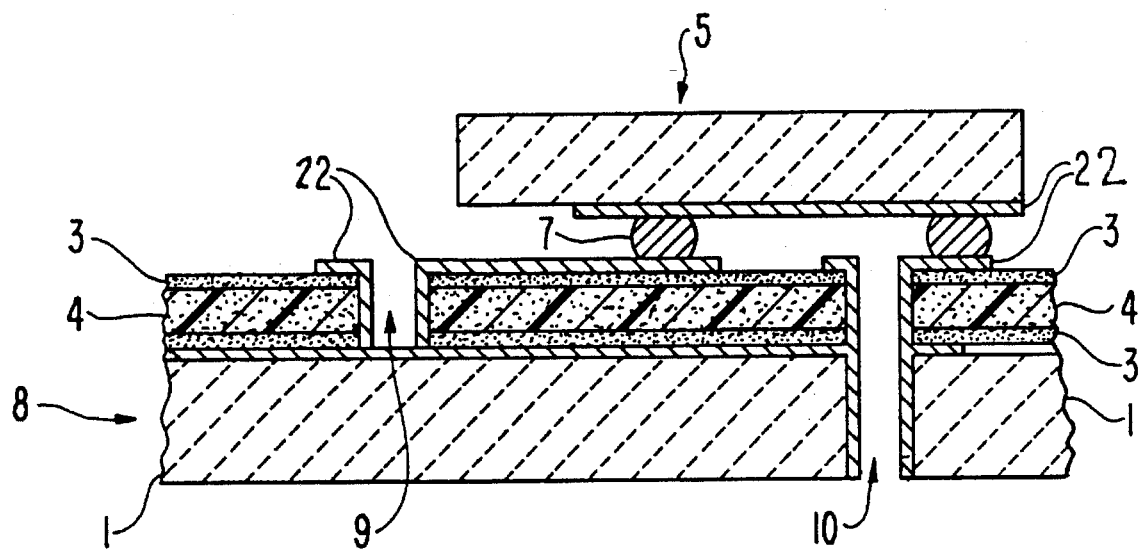
FIG. 2 is a partial cross-sectional view of an electronic component surface mounted on the circuit board of FIG. 1.

A circuit board or printed wiring board 8 is provided in cross section in FIG. 2. The circuit board is defined by first and second surfaces upon which may be mounted components 5, such as but not limited to semiconductor chips or other various electronic devices, for example. The circuit board 8 is defined by a support layer 1, which includes a top and a bottom surface, a means for absorbing shear stress 4, and a conductive layer which defines electrical circuit traces 22.

The support layer 1 may be made from any suitable material such as a ceramic fiber, including a glass filled epoxy resin material, for example. This material has the requisite electrical insulative, physical, and other properties for use as a circuit board. A material which may be particularly effective in use as a support layer 1 is referred to as an epoxy glass-filled FR4 board.

Figure 1:
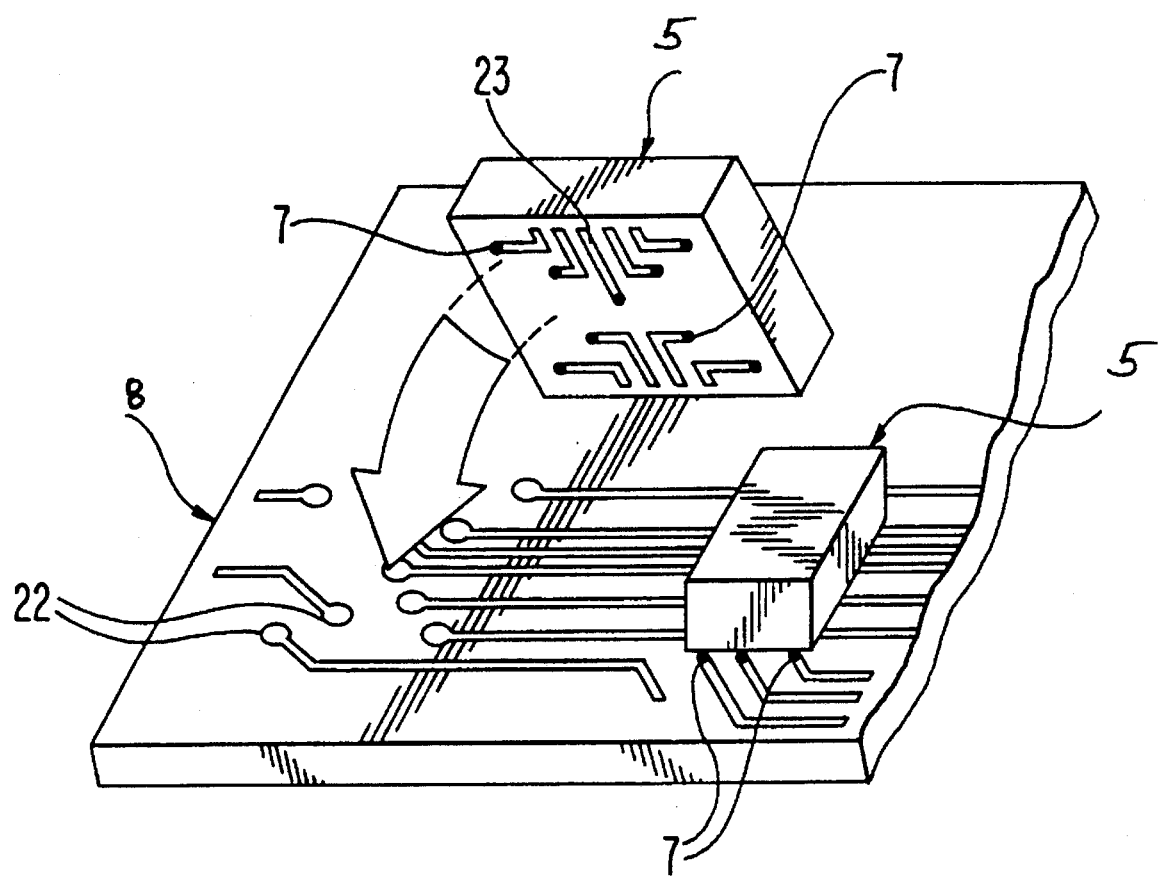
FIG. 1 is a perspective diagram of a circuit board of the present invention with one electronic component surface mounted on the circuit board and another electronic component shown raised above the circuit board surface.

As best seen by FIG. 1, the components 5 define electrical circuit traces 23, which are mounted face down in electrical contact with the electrical circuit traces 22 thereby defining the electrical circuit of the board 8. The components may be electrically connected to the circuit board by methods which are generally known, such as but not limited to electrically conductive adhesives or metallic solder materials. In one widely accepted method of attaching electrical components to a circuit board, metallic solder bumps or droplets 7 are positioned in contacting relation with the electrical circuit traces 22 and 23. The solder of bumps 7 is then caused to be reflowed by heating both the components and the circuit board to electrically connect the components with the circuit board.

The shear stress absorbing means 4 absorbs shear stress caused by unequal thermal coefficients of expansion between a component 5 and the circuit board 8. The shear stress absorbing means 4 comprises a layer of expanded polytetrafluroethylene having a compressive modulus of less than 50,000 pounds per square inch (PSI). The layer of expanded polytetrafluroethylene has a thickness ranging from about 0.002 to 0.025 inches. A thickness of about 0.005 inches may be particularly effective in use. Having a compressive modulus of less than 50,000 PSI prevents structural damage to the circuit board, the components and/or the electrical joint connections when the circuit board is assembled by use of heat to either reflow the solder bumps 7 or to cause conductive polymer bumps to adhere to metal surfaces. For the same reasons, heat cycling the circuit board of the present invention does not cause problems associated with dimensional change of the component parts thereof.

The layer of expanded polytetrafluroethylene is completely bonded to a top surface of the support layer by way of a bonding medium 3, such as but not limited to a suitable adhesive or epoxy. The bonding medium may be applied as a uniform layer or may be distributed in a dot-like pattern. However, it is imperative that the layer of expanded polytetrafluroethylene is completely bonded to the top surface of the support layer.

The expanded polytetrafluoroethylene used in a preferred embodiment of the present invention may be prepared by any number of known processes, but is preferably prepared by expanding PTFE as described in U.S. Pat. Nos. 4,187,390; 4,110,392; 3,953,566; 3,962,153; 4,096,227; 4,902,423; and 4,478,665 (incorporated herein by reference). The expanded polytetrafluoroethylene should be characterized by a high porosity, a very low dielectric constant, a very low coefficient of thermal expansion, and should be virtually devoid of elastic modulus. The pores of the expanded polytetrafluoroethylene are micropores formed by nodes and debris.

The electrical traces 22 are bonded to the shear stress absorbing means 4 by way of the bonding medium 3. The bonding medium 3 may be of the same or similar composition as the support layer 1. The electrical traces 22 and 23 may be interconnected by conductive metal plated vias 9 and 10. As best seen by FIG. 2, vias 10 may be formed completely through the circuit board to provide electrical communication between the first and second circuit board surfaces.

Without intending to limit the present invention, the following example serves to illustrate how the present invention can be made and used:

EXAMPLE

To assemble a circuit board 8 in accordance with the present invention the following process steps are performed:

First, the support layer 1 is manufactured using conventional techniques consistent with either a ceramic or an organic substrate. If an organic substrate is to be used, such as an FR4 printed wiring board, the plated vias 10 do not have to be completed at this stage. However, if a ceramic support layer is used, the vias 10 should be completed prior lamination.

The shear stress absorbing means 4 and the conductive layer are laminated to the support layer 1 using a hydraulic press or autoclave press at a suitable temperature for curing the layers to the support layer 1. For example, in the case of an FR4 epoxy support layer, the temperature should be approximately 175° C. In the case of a cyanate ester support layer, a temperature of about 240° C. is suitable for curing. The laminating process should also be performed at pressures of less than 50 PSI, and preferably less than 25 PSI. Cure times and profiles are adhesive specific. For example, in the case of epoxy, approximately 90 minutes is a suitable cure time. In the case of a cyanate ester circuit board, approximately 4 hours is suitable. It is important to laminate the shear stress absorbing means against a smooth surface, such as a polished steel plate for example, to avoid damaging the foil due to the low modulus of elasticity of the shear stress absorbing means 4.

After the circuit board 8 is removed from the press, vias 9 and 10 are formed either by drilling or laser techniques. These vias are then plated with a conductive metal and the electrical circuit traces 22 and surface image are formed. There are variations in the sequence of the via formation and imaging steps which are well known, and which should not be excluded because they are not specifically mentioned herein.

The apparatus of the present invention requires no particular customization for its manufacture. For example, prior to laminating the shear stress absorbing means 4 to the support layer 1, no action is required for preparing particular areas of the support layer 1 for non-bonding and other areas for bonding. This is a significant advantage over previous methods of circuit board manufacture.

It is a further advantage of the present invention that a circuit board 8 can be made from economical materials, and by simple economical methods to provide a circuit board having excellent electrical and physical properties and which is stable under heat stress.

I claim:

1. A circuit board having first and second surfaces, the circuit board mounting at least one electronic component on a predetermined circuit board surface, the circuit board comprising:

a support layer having a top and a bottom surface;

means for absorbing shear stress caused by unequal thermal coefficients of expansion between the at least one electronic component and the circuit board, the shear stress absorbing means comprising a layer of expanded polytetrafluroethylene having a compressive modulus of less than 50,000 PSI, the layer of expanded polytetrafluroethylene being completely bonded to the top surface of the support layer;

bonding medium for completely bonding the shear stress absorbing means to the support layer;

a conductive layer bonded to the shear stress absorbing means; and at least one electronic component electrically connected to the conductive layer.

2. The circuit board of claim 1 further comprising at least one conductively plated aperture formed completely through the circuit board to provide electrical contact between the first and second circuit board surfaces.

3. The circuit board of claim 1 wherein the shear stress absorbing means comprises a layer of expanded polytetrafluroethylene having a thickness from about 0.002 to 0.025 inches.

4. The circuit board of claim 1 wherein the shear stress absorbing means comprises a layer of expanded polytetrafluroethylene having a thickness of 0.005 inches.

5. A circuit board which resists shear stress caused by thermal expansion, the circuit board having first and second surfaces and comprising:

a support layer having a top and a bottom surface;

a layer of expanded polytetrafluoroethylene having a compressive modulus of less than 50,000 PSI, the layer of expanded polytetrafluroethylene having a thickness from about 0.002 to 0.025 inches and being completely bonded to the top surface of the support layer;

a conductive layer bonded to the layer of expanded polytetrafluroethylene; and at least one electronic component electrically connected to the conductive layer.

6. The circuit board of claim 5 further comprising at least one conductively plated aperture formed completely through the circuit board to provide electrical contact between the first and second circuit board surfaces.

7. A circuit board comprising:

a support layer having a top and a bottom surface;

a layer of expanded polytetrafluoroethylene having a compressive modulus of less than 50,000 PSI, the layer of expanded polytetrafluoroethylene having a thickness from about 0.002 to 0.025 inches and being completely adhesively bonded to the top surface of the support layer;

a conductive layer bonded to the layer of expanded polytetrafluroethylene means; and at least one conductively plated aperture formed completely through the circuit board to provide electrical contact between the first and second circuit board surfaces.

8. A circuit board which resists strain caused by thermal expansion, the circuit board having first and second surfaces and comprising:

a support layer having a top and a bottom surface;

a layer of expanded polytetrafluoroethylene having a compressive modulus of less than 50,000 PSI, the layer of expanded polytetrafluroethylene having a thickness from about 0.002 to 0.025 inches and being completely adhesively bonded to the top surface of the support layer; and a conductive layer bonded to the layer of expanded polytetrafluroethylene.

* * * * *